United States Patent
Kariya et al.

[11] Patent Number: 5,849,108
[45] Date of Patent: Dec. 15, 1998

[54] PHOTOVOLTAIC ELEMENT WITH ZNO LAYER HAVING INCREASING FLUORINE CONTENT IN LAYER THICKNESS DIRECTION

[75] Inventors: Toshimitsu Kariya; Keishi Saito, both of Nara, Japan

[73] Assignee: Canon Kabushiki Kaisha, Tokyo, Japan

[21] Appl. No.: 638,501

[22] Filed: Apr. 26, 1996

[51] Int. Cl.[6] .............. H01L 31/0264; H01L 31/0392; H01L 31/036

[52] U.S. Cl. .................. 136/265; 136/256; 136/258; 136/261

[58] Field of Search ................. 136/256, 258, 136/261, 265; 428/411.1, 412, 457, 688, 689

[56] References Cited

U.S. PATENT DOCUMENTS

| | | | |
|---|---|---|---|
| 4,400,409 | 8/1983 | Izu et al. | 427/39 |
| 4,990,286 | 2/1991 | Gordon | 252/518 |
| 5,397,920 | 3/1995 | Tran | 257/749 |
| 5,429,685 | 7/1995 | Saito et al. | 136/255 |

FOREIGN PATENT DOCUMENTS

| | | | |
|---|---|---|---|
| 1-194208 | 8/1989 | Japan | H01B 5/14 |

OTHER PUBLICATIONS

Abstract—JP 05–259,692 Kariya et al. May 2, 1995.

Hattori, et al. "High–Conductive Wide Band Gap P–Type a–SiC:H Prepared By ECR CVD and Its Application To High Efficiency a–Si Basis Solar Cells", 19th IEEE Photovoltaic Specialists Conf., pp. 689–694 (1987).

*Primary Examiner*—Bernard P. Codd
*Attorney, Agent, or Firm*—Fitzpatrick, Cella, Harper & Scinto

[57] ABSTRACT

A photovoltaic element has a substrate with a conductive surface, a zinc oxide layer containing fluorine and a non-single-crystal semiconductor layer, where the fluorine content of the zinc oxide layer (i) varies across the thickness of the layer, (ii) is at a minimum at the interface with the substrate and (iii) increases toward the semiconductor layer.

16 Claims, 3 Drawing Sheets

PHOTOVOLTAIC ELEMENT WITH ZNO LAYER HAVING INCREASING FLUORINE CONTENT IN LAYER THICKNESS DIRECTION

BACKGROUND OF THE INVENTION

1. Field of the Invention

The present invention relates to a photovoltaic element comprising a pin layer comprising non-single-crystal silicon type semiconductor material and a zinc oxide thin film layer interposed between a substrate and the pin layer. The photovoltaic element is utilized for a solar cell, photodiode, electrophotographic photosensitive member, light-emitting element and the like.

2. Related Background Art

In recent years, a study has been energetically carried out of photovoltaic elements with a zinc oxide (ZnO) thin film layer being used as a transparent conductive film. For example, an improvement in electric characteristics of fluorine-doped ZnO with a texture structure was made in "Optimization of Transparent and Reflecting Electrodes for Amorphous Silicon Solar Cells.", Gordon, R. G., Hu, J., Musher, J., Giunta, C., US DOE Rep. pp. 44, 1991. In addition, a transparent conductive film having a low resistance and a high transmittance with a fluorine-added ZnO was obtained in Japanese Patent Application Laid-Open No. 1-194208.

"Research on amorphous silicon based thin film photovoltaic devices. Task B: Research on stable high efficiency, large area amorphous silicon based submodules.", Delahoy A. E., Ellls, F. B. Jr., Kampas, F. J., Tonon, T., Weakllem, H. A., US DOE Rep. pp. 48, 1989 (–50 Å/s) reported a solar cell using an excellent high quality doped ZnO.

Studies of a solar cell using the microwave plasma CVD process (MWPCVD process) were also carried out as below: "a-Si solar cell by the microwave plasma CVD process", Azuma, K., Watanabe, T., Shimada, H., Preprints for 50th Scientific Lecture Meeting of Applied Physics Society, pp. 566 can be mentioned. In this photovoltaic element, a good quality and high deposition rate i-layer was obtained by forming an i-layer with the MWPCVD process.

Examples of doping layer formation with the MWPCVD process can be given as follows:

"High Efficiency Amorphous Solar Cell Employing ECR-CVD Produced p-Type Microcrystalline SiC Film", Y. Hattori, D. Kruangam, T. Toyama, H. Okamoto and Y. Hamakawa, Proceedings of the International PVSEC-3 Tokyo Japan 1987 pp. 171; and "HIGH-CONDUCTIVE WIDE BAND CAP P-TYPE a-SiC:H PREPARED BY ECR CVD AND ITS APPLICATION TO HIGH EFFICIENCY a-Si BASIS SOLAR CELLS", Y. Hattori, D. Kruangam, K. Katou, Y. Nitta, H. Okamoto and Y. Hamakawa, Proceedings of 19th IEEE Photovoltaic Specialists Conference 1987 pp. 689.

In these photovoltaic elements, a good quality p-layer was obtained by employing MWPCVD for production of the p-layer.

In addition, studies of a non-single-crystal silicon type semiconductor layer containing fluorine and photovoltaic elements employing it are being forwarded. For example, "Investigation into putting amorphous solar cell to practical use. Technical investigation on manufacture of high reliability amorphous solar cell elements," General situation of research and development on the sunshine plan, Solar energy 1, Light utilization technique VOL. 1985 pp.I.231-I.243, 1986;

"The chemical and configurational basis of high efficiency amorphous photovoltaic cells", Ovshinsky, S. R., Proceedings of 17th IEEE Photovoltaic Specialists Conference 1985 pp. 1365;

"Development of the scientific and technical basis for integrated amorphous silicon modules. Research on a-Si:F:H (B) alloys and module testing at IET-CIEMAT." Gutierrez, M., T. P. Delgado L, Photovolt. Power Gener., pp. 70–75, 1988; and The effect of fluorine on the photovoltaic properties of amorphous silicon", Konagai, M., Nishihata, K., Takahashi, K., Komoro, K., Proceedings of 15th IEEE Photovoltaic Specialists Conference 1981, pp. 906. In these examples, however, mention is made of deterioration by light phenomenon and thermal stability but not of peeling-off of a semiconductor layer.

Studies of photovoltaic elements containing microcrystalline silicon have also been energetically carried out, but no mention has been made of layer separation.

U.S. Pat. No. 4,400,409 discloses a plasma CVD apparatus for continuously forming a semiconductor layer by adopting the Roll to Roll system. The photovoltaic element according to the present invention is preferably produced in series by use of such an apparatus. According to this apparatus, a plurality of depositing chambers are provided, a strip-like and elastic substrate is placed along the route through which the substrate passes the depositing chambers in succession and the substrate is continuously conveyed in the longitudinal direction while a semiconductor layer having a desired conductivity type is formed in the depositing chambers, so that a photovoltaic element with pin junctions are continually fabricated. Incidentally, in the U.S. patent, a gas gate is employed for preventing a raw material gas for incorporating into a semiconductor layer the respective valence electron controlling agent from diffusing into other depositing chambers to be mixed into other semiconductor layer. Specifically, adjacent depositing chambers are separated with a slit-like separating passage from each other and a scavenging gas such as Ar, $H_2$ or He is allowed to flow into the respective passages separately to prevent the mutual diffusion of individual raw material gases.

This Roll-to-Roll system formation method is effective in producing a photovoltaic element such as one according to the present invention.

With the above conventional photovoltaic elements, upgrade is hoped for in preventing photo-excited carriers from recombination near the ZnO/pin layer interface or the ZnO/substrate interface. In addition, with these photovoltaic elements, improvement in open-circuit voltage and short-circuit current is also hoped for.

The effect that, when light is irradiated for a long period of time, the photoelectric conversion efficiency decreases, what is called, deterioration by light, is at issue. And, the effect that, when vibration is given for a long period of time, the photoelectric conversion efficiency decreases, what is called, deterioration by vibration, is at issue.

Furthermore, optical and deterioration by vibration at application of a bias voltage to a photovoltaic element have been at issue.

Still further, a photovoltaic element containing at least one of Ag, Al and In in the substrate has had a problem of short circuit when a bias voltage remains to be applied thereto for a long period of time.

And when a non-single-crystal silicon type semiconductor layer containing microcrystalline silicon is formed on a ZnO thin film, there has been a problem that layer peeling off is more likely to occur than observed in those containing no microcrystalline silicon.

And when a non-single-crystal silicon type semiconductor layer containing fluorine is formed on a zinc oxide thin film layer, there has been a problem that layer peeling off is more likely to occur than observed in those containing no fluorine.

In addition, when preserved over a long period of time or transported in a roll-like wound state, a ZnO thin film layer formed by the roll-to-roll process has had a problem that layer peeling off is apt to occur.

SUMMARY OF THE INVENTION

It is an object of the present invention to provide a photovoltaic element which solves the above conventional problems, that is, to prevent the separation of layers and to suppress the recombination of photo-excited carriers near the ZnO/pin layer interface and the ZnO/substrate interface.

Another object is to improve the open-circuit voltage and the short-circuit current and to upgrade the photoelectric conversion efficiency.

And yet another object is to suppress the deterioration by light and deterioration by vibration.

Still another object is to suppress the deterioration by light and deterioration by vibration at the time of application of a bias voltage.

A further object is to prevent a short circuit, with a photovoltaic element containing at least one of Ag, Al and In in the substrate, even if a bias voltage remains to be applied to the photovoltaic element for a long period of time.

And another object is to prevent the peeling off of layer even in a photovoltaic element with a non-single-crystal silicon type semiconductor layer containing microcrystalline silicon formed on a ZnO thin film layer.

Yet another object is to prevent the peeling off of layer even in a photovoltaic element having a non-single-crystal silicon type semiconductor layer containing fluorine.

A further object is to provide a photovoltaic element hardly subjected to a separation of layers even in a roll-like wound state.

The present invention has been accomplished as a result of intensive study for solving the conventional problems and for attaining the above objects. The photovoltaic element according to the present invention is characterized in that a zinc oxide layer containing fluorine and an non-single-crystal semiconductor layer are stacked in this sequence on a conductive substrate, that the zinc oxide thin film layer is a crystalline one of c-axis orientation and has unevenness of 0.1–1.0 $\mu$m at a surface, and further that fluorine is nonuniformly contained in the zinc oxide thin film layer, where the fluorine content varies in the layer thickness direction, is minimum at the interface with the substrate and gradually increase toward the pin layer.

A preferred aspect of the present invention is a photovoltaic element wherein the c-axis is nearly perpendicular to the substrate surface.

Another preferred aspect of the present invention is a photovoltaic element wherein the fluorine content is large near the crystal grain boundaries of the zinc oxide thin film layer.

Yet another preferred aspect of the present invention is a photovoltaic element wherein the n-layer in contact with the zinc oxide thin film layer contains microcrystalline silicon.

Still another preferred aspect of the present invention is a photovoltaic element wherein the layer in contact with the zinc oxide thin film layer is the p- or n-layer, containing fluorine.

A further preferred aspect of the present invention is a photovoltaic element wherein the substrate is elastic and in the form of a strip and can be wound in a roll-like shape.

DESCRIPTION OF THE PREFERRED EMBODIMENTS

Figure 1:
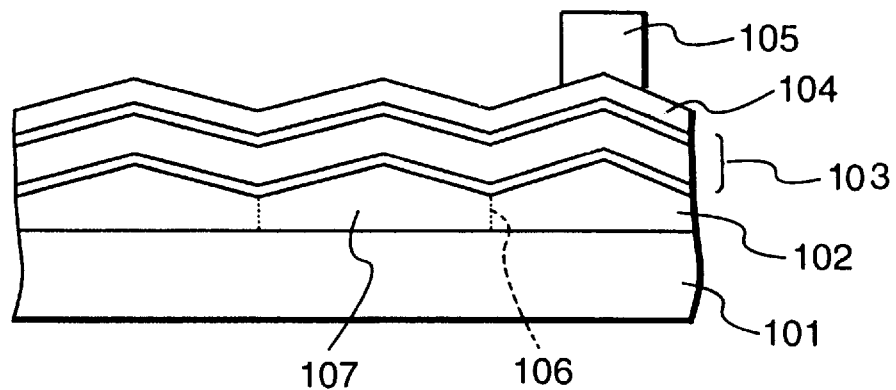
FIG. 1 is a view showing the layer constitution of a photovoltaic element according to an example of the present invention.

Hereinafter, the present invention will be described referring to the drawings.

FIG. 1 is a schematically explanatory drawing of a photovoltaic element for illustrating the concept of the present invention.

In FIG. 1, a photovoltaic element according to the present invention comprises a substrate 101, a ZnO thin film layer (hereinafter simply referred to as "ZnO film layer") 102 having a surface unevenness and a c-axis orientation, a pin layer 103 comprising non-singlecrystal silicon type semiconductor material, a transparent electrode 104 and a collector electrode 105.

The photovoltaic element of FIG. 1 is normally irradiated with light from the side of the transparent electrode 104, but may be irradiated from the back side of the substrate 101. In that case, the substrate 101 is made of a light-transmitting material, while a light-reflecting layer made of a metallic material may be formed on the pin layer in place of the transparent electrode 104.

In addition, the pin layer 103 of the photovoltaic element according to the present invention may comprise a stack of pin structures such as pinpin structure or pinpinpin structure.

Furthermore, the pin layer 103 of a photovoltaic element according to the present invention may comprise a stack of nip structures such as nipnip structure or nipnipnip structure.

In the photovoltaic element of the present invention, since fluorine is contained in the ZnO film layer 102, recombination of photo-excited carriers at the interface between the ZnO thin film layer 102 and the pin layer 103 as well as at the interface between the ZnO film layer 102 and the substrate 101 can be reduced. In addition, since the internal stress produced at the interface between the ZnO film layer 102 and the pin layer 103 as well as at the interface between the ZnO film layer 102 and the substrate 101 is reduced, the deterioration by light of the photovoltaic element (lowering in element characteristics due to a long-time light irradiation) and the deterioration by vibration (lowering in element characteristics due to a long-time application of vibration) can be suppressed. The above effect is further strengthened when the fluorine content varies in the layer thickness direction, is a minimum at the interface with the substrate and increases toward the non-single-crystal semiconductor layer. It is preferred that the fluorine content is within a range from 0.1 to 10 atomic %.

The deterioration by light of a photovoltaic element is attributable to lowering in element characteristics resulting from the fact that weak bonds break out with optical energy and the broken bonds become recombination centers of photo-excited carriers. Further, the deterioration by vibration of a photovoltaic element is attributable to lowering in element characteristics resulting from the fact that weak bonds break out with vibration energy and the broken bonds become recombination centers of photo-excited carriers. These weak bonds are considered to be localized in the area where stress is produced. Thus, reducing recombination centers generated at the interface between the ZnO film layer and the pin layer is especially important.

In addition, since a slight amount of fluorine acts as an n-type valence electron controlling agent in the ZnO film, the conductivity of the film can be raised and the transmittance of light of the ZnO film is not injured. Furthermore, the electric contact with the non-single-crystal semiconductor layer deposited on the ZnO film layer is improved, the localized levels at the interface are reduced and properties as a photovoltaic cell is improved. That is, when light is irradiated from the side of the transparent electrode 104, the light not absorbed in the pin layer can penetrate the ZnO layer with good efficiency, thereby enabling an increase in short-circuit current. On the other hand, when light is irradiated from the rear side of the substrate 101, the light is led to the pin layer with good efficiency.

In the present invention, it is preferred that a c-axis oriented crystalline layer is employed as the ZnO film layer. Thus, as shown in FIG. 1, unevenness is formed at the surface of the ZnO film and light can efficiently be led to the pin layer and the short-circuit photocurrent of the photovoltaic element can be increased. That is, when light is incident from the side of the transparent electrode, light is refracted at the transparent electrode surface and at the pin layer surface, so that the optical length for light incident on the pin layer to reach the crystalline ZnO layer surface is prolonged and accordingly a greater quantity of light can be absorbed in the pin layer. Furthermore, when the substrate is made of a light-reflecting material, the light remaining not absorbed in the pin layer can be allowed to be incident on the pin layer again from the side of the substrate and to be absorbed. At that time, since the crystalline ZnO film layer 102 has a rugged surface, the reflected light can be reflected also at this surface, so that the optical path length from the incidence at the pin layer to the arrival at the surface of the crystalline ZnO layer can be prolonged and a larger amount of light can be absorbed in the pin layer. Further, when the substrate is made of a material which reflects light, the light not absorbed by the pin layer can be made incident again upon the pin layer from the substrate side and absorbed by the pin layer. In that case, since the surface of the crystalline ZnO film layer 102 is uneven, the reflected light can be refracted at the surface, thereby prolonging the optical path length to more efficiently absorb the light. For absorption of the visual light, it is effectively absorbed when the height of protrusions of the unevenness ranges from 0.1 to 1.0 $\mu$m.

Above all, it is preferable that each crystal grain 107 comprises a wurtzite crystal and the c-axis (hexagonal rotation axis) is nearly perpendicular to the substrate. In this way, light can be more effectively directed to the pin layer. For making the c-axis nearly perpendicular to the substrate, it is only necessary to apply a DC bias and/or RF bias for raising the plasma voltage or to apply a negative DC bias to the substrate in forming a ZnO film layer with the sputtering process. Further, for making the c-axis nearly perpendicular to the substrate, it is only necessary to form numberless fine protrusions on the substrate surface. For example, it is only necessary to form an Ag thin film layer on a support of a stainless steel plate at a support temperature of 200°–600° C. It is preferable that these protrusions are formed at nearly equal intervals.

In addition, by allowing the crystal grain boundary 106 to contain a large quantity of fluorine, the diffusion of impurities from the substrate can be prevented from the substrate. That is, when employing a material containing an impurity, e.g., a certain type of metal elements adversely affecting the pin layer, for the substrate, this impurity must be prevented from diffusing into the pin layer. With a crystalline ZnO film layer as shown in FIG. 1, an impurity cannot but diffuse through the crystal grain boundary, which may lower the element characteristics. Especially when a bias voltage is applied to the element for a long time, such an effect appears noticeably, the shunt resistance extremely decreases and characteristics such as photoelectric conversion efficiency is worsened.

This is considered to be because the presence of gaps and voids at a crystal grain boundary facilitates the diffusion of impurities. Thus, by allowing a crystal grain boundary to contain a large quantity of fluorine, these gaps and voids are decreased to prevent the diffusion. And by allowing a crystal grain boundary to contain a large quantity of fluorine, dangling bonds are increased and react with impurities diffused, thereby preventing the diffusion. The fluorine content is desirably several times that of the inside of the crystal bulk.

In the present invention, the n layer being in contact with the ZnO film layer contains fluorine. As compared with those not containing fluorine, a p layer or n layer containing fluorine has advantages of higher conductivity, less deterioration by light and higher thermal stability, but had a problem in easy separation of layers because the film was dense. In the present invention, since a large quantity of fluorine is contained in a surface of the ZnO film layer, the stress is released and the interlayer bonding strength is increased, thereby preventing layer peeling off. Furthermore, the i layer and the p layer may contain fluorine.

In the photovoltaic element of the present invention, it is preferable that the p or the n layer and the i layer are formed using the RF plasma CVD (RFPCVD) process or the microwave plasma CVD (MWPCVD) process. Especially the MWPCVD process exhibits a high deposition rate, can increase the throughput and can raise the utilization efficiency of raw gases and consequently can upgrade the productivity. When a doping layer is formed using the MWPCVD process, a doping layer having a good characteristic for a photovoltaic element is obtained. That is, because of being good in light transmittance, high in electric conductivity and small in activation energy, the doping layer is excellent. Furthermore, using the MWPCVD process, a good quality amorphous silicon type semiconductor material or a wide band gap and good quality amorphous silicon type semiconductor material can be relatively easily formed and therefore the MWPCVD process is effective as a doping layer forming method. In addition, since the i layer is thicker than the p layer and the n layer, this process is especially effective.

The ZnO film layer of the present invention is preferably formed employing the sputtering process. Above all, a magnetron sputtering process with high deposition speed and the microwave sputtering process to be described below is suitable. The microwave sputtering process is a method comprising the steps of: introducing an inert gas or a reactive gas into a vacuum vessel; irradiating the gas with a microwave to generate ions; applying electromagnetic energy to a target to accelerate the ions to thereby irradiate the target surface with the accelerated ions, thereby sputtering the target to form a deposited film on the substrate surface with a high speed. As the electromagnetic energy, RF power or DC power is suitable.

In the photovoltaic element of the present invention, since the pin layer and the ZnO layer is formed on the elastic strip-like substrate, the element can be wound in a roll-like shape, occupies no large space for custody or transport, and is easy to handle. Further, it is suitable for production using the Roll-to-Roll method and can improve the productivity significantly.

In the photovoltaic element of the present invention, since fluorine is contained in the ZnO film layer as mentioned above, layers are difficult to be peeled off even in a roll-like wound state.

Though a photovoltaic element with the pin structure was described above, the present invention is applicable either to photovoltaic elements comprising a stack of pin structures such as a pin pin structure or a pin pin pin structure, or to photovoltaic elements comprising a stack of nip structures such as a nip nip structure or a nip nip nip structure.

Figure 2:
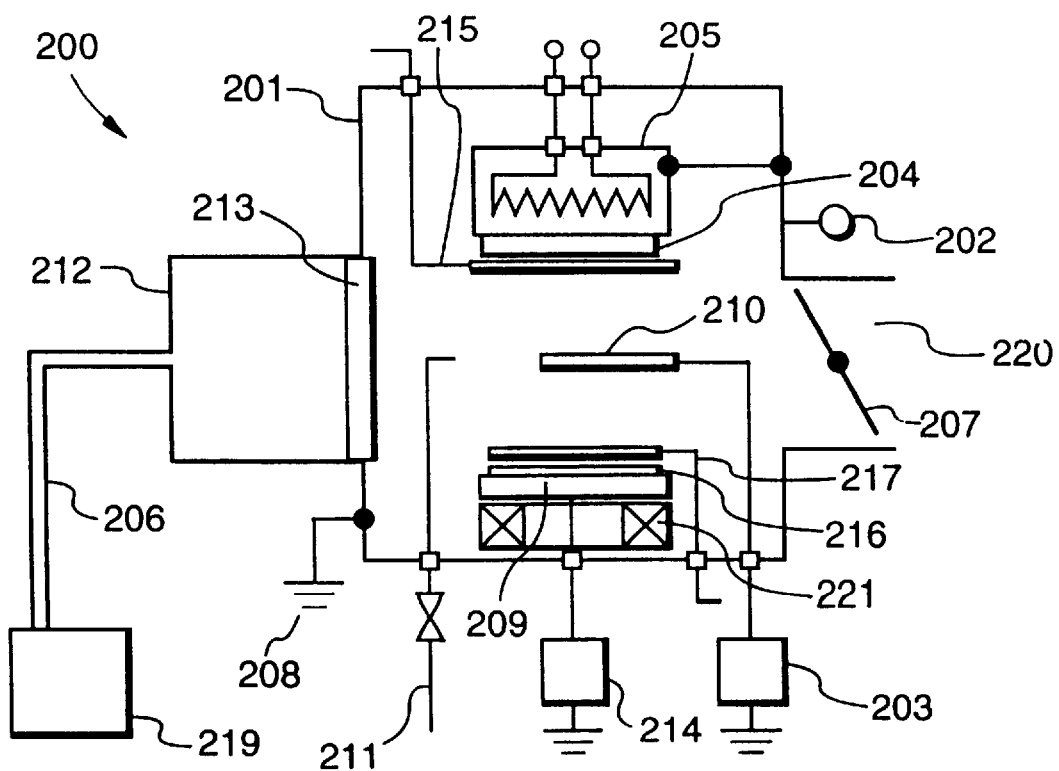
FIG. 2 is a conceptual drawing of a deposition apparatus used for producing a photovoltaic element according to an example of the present invention.

FIG. 2 is an explanatory schema of a deposition apparatus suitable to the formation of a photovoltaic element according to the present invention. The deposition apparatus 200 comprises a depositing chamber 201, a vacuum meter 202, a bias power supply 203, a substrate 204, a heater 205, a wave guide 206, a conductance valve 207, a valve 208, a leak valve 209, a bias electrode 210, a gas introducing pipe 211, an applicator 212, a dielectric window 213, a sputter electrode 214, a substrate shutter 215, a target 216, a target shutter 217, a microwave power supply 219, a toroidal coil 221, and a vacuum exhaust pump and a raw gas supply device not shown. The vacuum exhaust pump is connected to the exhaust port 220 in FIG. 2, and the raw gas supply device, comprising a raw gas cylinder, a valve and a mass flow controller, is connected to the gas introducing pipe. The dielectric window is made of a material well transmitting a micro wave such as alumina ceramics, quartz and boron nitride.

Fabrication of a photovoltaic element is carried out as follows: First, exhaust the interior of the depositing chamber sufficiently below $1\times10^{-5}$ Torr with the substrate 204 set in close contact with a heater 205 installed in the depositing chamber 201 of FIG. 2. For this exhaustion, a turbomolecular pump or an oil diffusion pump or a cryopump is suitable. Then, introduce an inert gas such as Ar into the depositing chamber and turn on the switch of the heater to heat the substrate. When the substrate temperature is stabilized to a predetermined temperature, adjust the conductance valve 207 so as to set the in-chamber pressure at a predetermined pressure and execute the ZnO film layer formation method to be described below in detail. Next, execute the pin layer formation method to be described below in detail. Next, replace the target with an $In_2O_3$—$SnO_2$ (5 wt %) target in vacuum, introduce $O_2$ gas into the depositing chamber and accomplish the DC magnetron sputtering process to form an ITO layer on the pin layer. Next, leak the depositing chamber, form a comb-shaped collector electrode on the ITO surface with the electron beam vacuum deposition process and finish the fabrication of a photovoltaic element.

For formation of a pin layer, it is preferable to use the MWPCVD process and the RFPCVD process.

When forming a pin layer with the MWPCVD process, introduce raw gas into the depositing chamber, adjust the pressure with the conductance valve 207 and irradiate microwave through the waveguide 206 and the applicator 212 to the raw gas to generate plasma. The pressure during forming the pin layer is a very important factor and the optimum pressure in the depositing chamber is 0.5–50 mTorr. In addition, the MW power introduced in the depositing chamber is an important factor. The MW power is to be appropriately determined by the flow rate of the raw gas introduced into the depositing chamber, but is preferably in the range of 100–5000 W. A preferred frequency range of MW power can be mentioned as 0.5–10 GHz. Especially, a frequency near 2.45 GHz is appropriate. After a desired layer thickness was formed, stop the introduction of MW power, exhaust the interior of the depositing chamber fully and form the next layer after a complete purge of gases such as $H_2$, He and Ar.

In forming the pin layer, RF power may be applied to the bias electrode 210 together with MW power. In this case, the MW power introduced is preferably smaller than that required for complete decomposition of the raw gas introduced in the depositing chamber, and further the RF power introduced simultaneously is preferably larger than the MW power. Preferable ranges of RF power introduced simultaneously is from 200 to 10000 W. A preferable frequency range of RF power is from 1 to 100 MHz. Especially, 13.56 MHz is the most appropriate. When the area of a bias electrode for RF power supply is smaller than that of the ground, it is preferable to connect the self-bias (DC component) on the side of a power source for RF power supply to the ground. Furthermore, a DC voltage may be applied to the bias electrode. A preferable range of DC voltage is on the order of 30–300 V. An RF power and DC power may be simultaneously applied to the bias electrode.

(B) When depositing a pin layer with the RFPCVD process, a capacity-coupling type RFPCVD is suitable.

When forming a pin layer with the RFPCVD process, introduce a raw gas into the depositing chamber and apply an RF power to the bias electrode to produce plasma. The optimal conditions are mentioned as 100°–500° C. for substrate temperature, 0.1–10 Torr for pressure, 1–2000 W for RF power and 0.1–2 nm/sec for deposition rate. After a desired layer thickness is formed, stop the introduction of RF power, fully exhaust the interior of the depositing chamber and form the next layer after a complete purge of gases such as $H_2$, He and Ar.

To form a ZnO film layer containing fluorine the content of which is varied, the following methods can be mentioned.

(1) When formed with the sputtering process:

The RF magnetron sputtering method with a high formation rate is suitable. In this case, Ar gas and $O_2$ gas are introduced into the depositing chamber with a toroidal coil installed around a target, a target containing fluorine and made of ZnO:F is mounted on the target electrode 209, the substrate temperature is set at 200°–600° C., an RF (1–100 MHz) power is applied and plasma is produced to form a ZnO film layer on the substrate.

At that time, the pressure inside the depositing chamber is a parameter closely related to the forming rate of a deposited film and accordingly is appropriately determined depending on the type of gas to be introduced and the size of a depositing chamber, but is normally 1–30 mTorr for the present invention. In addition, the above gas is introduced from the gas cylinder through the mass flow controller to the depositing chamber in a predetermined amount, where the introduced amount is appropriately determined depending on the volume of the depositing chamber. Further, $O_2$ gas may be introduced in addition to Ar gas.

In addition, to change the fluorine content in the layer thickness direction, an RF power is only required to vary with the lapse of time. That is, because the RF power dependence of a sputter rate differs between ZnO and fluorine, the fluorine content increases with higher RF power and decreases with lower RF power.

In addition, for an increase in fluorine content at the grain boundary, it is only necessary to raise an RF power just before each crystal grain comes into contact with its neighboring crystal grains.

(2) When formed with the sputtering process+the RFPCVD process:

In the above RF magnetron sputtering process, it is only necessary to introduce a fluorine-containing gas such as $F_2$ gas, HF gas and the like anew and to change its introduced amount with the lapse of time. In this case, a target made of ZnO not containing fluorine may be employed.

In addition, to increase the fluorine content at the crystal grain boundary, it is only necessary to flow the fluorine-containing gas in a large quantity just before each crystal grain comes into contact with its neighboring crystal grains.

(3) When formed with the microwave sputtering process:

Ar gas is introduced into the depositing chamber, the above target made of ZnO:F is mounted on the target electrode 209, the substrate temperature is set at 200°–600° C., an RF (1–100 MHz) power or DC power (100–600V) is applied. A microwave power generated by a microwave power source is transmitted, enlarged in the applicator and irradiated through the dielectric window 213 to the above gas to produce plasma, so that a ZnO film layer is formed on the substrate.

At that time, the pressure inside the depositing chamber is a parameter closely related to the forming rate of a deposited film and accordingly is appropriately determined depending on the type of gas to be introduced and the size of a depositing chamber, but is normally 0.1–10 mTorr for the present invention. In addition, the above gas is introduced from the gas cylinder through the mass flow controller to the depositing chamber in a predetermined amount, where the introduced amount is appropriately determined depending on the volume of the depositing chamber. Further, $O_2$ gas may be introduced in addition to Ar gas.

In addition, to change the fluorine content in the layer thickness direction, an RF power or a DC power is only required to vary with the lapse of time. That is, because the RF power (DC power) dependence of a sputter rate differs between ZnO and fluorine, the fluorine content increases with higher RF power (DC power) and decreases with lower RF power (DC power).

In addition, for an increase in fluorine content at the grain boundary, it is only necessary to raise an RF power (DC power) just before each crystal grain comes into contact with its neighboring crystal grain.

(4) When formed with the microwave sputtering process+ the MWPCVD process:

In the above microwave sputtering process, it is only necessary to introduce a fluorine-containing gas such as $F_2$ gas, HF gas, and the like anew and to change its introduced amount with the lapse of time. In this case, a target made of ZnO not containing fluorine may be employed.

In addition, to increase the fluorine content at the crystal grain boundary, it is only necessary to flow the fluorine-containing gas in a large quantity just before each crystal grain comes into contact with its neighboring crystal grains.

(5) When formed with the Roll-to-Roll system:

In the above microwave sputtering process or a normal sputtering process, it is only necessary to introduce a fluorine-containing gas such as $F_2$ gas, HF gas, and the like anew with the substrate temperature set at 200°–600° C., and to spatially change its introduced amount along the moving direction of the substrate.

In addition, to increase the fluorine content at the crystal grain boundary, it is only necessary to flow the fluorine-containing gas in a large quantity where each crystal grain comes into contact with its neighboring crystal grains.

In the above pin layer forming method, the following gases or compounds capable of being gasified by bubbling are appropriate as raw gases.

As raw gases for incorporating silicon atoms, $SiH_4$, $SiD_4$, $Si_2H_6$, $SiF_4$ and $Si_2F_6$ are appropriate.

As raw gases for incorporating fluorine atoms, $F_2$, HF, $SiF_4$, $GeF_4$, $CF_4$, $PF_5$ and $BF_3$ are appropriate.

As raw gases for incorporating carbon atoms, $CH_4$, $CD_4$, $C_2H_2$ and $CF_4$ are appropriate.

As raw gases for incorporating germanium atoms, $GeH_4$, $GeD_4$ and $GeF_4$ are appropriate.

As raw gases for incorporating tin atoms, $SnH_4$, $SnD_4$ and $Sn(CH_3)_4$ are appropriate.

As raw gases for introducing a Periodic Table III group atoms into the p layer, $B_2H_6$, B $(CH_3)_3$, B $(C_2H_5)_3$, Al $(CH_3)_3$ and $BF_3$ are appropriate.

As raw gases for introducing a Periodic Table V group atoms into the n layer, $PH_3$, $AsH_3$, and $PF_3$ are appropriate.

As raw gases for introducing a Periodic Table VI group atoms into the n layer, $H_2S$ and $H_2Se$ are appropriate.

As raw gases for allowing oxygen atoms to be contained in the pin layer, $O_2$, $CO_2$, CO and NO are appropriate.

As raw gases for allowing nitrogen atoms to be contained in the pin layer, $N_2$, NO, $NO_2$, $N_2O$ and $NH_3$ are appropriate.

Meanwhile, these raw gases may be optionally diluted with a gas such as $H_2$, $D_2$, He and Ar and introduced into the depositing chamber.

When forming the above fluorine-containing ZnO film layer, ZnO or ZnO:F is used as a target but Zn or Zn:F not containing oxygen may be also employed. When a target not containing oxygen is employed, it is required to introduce $O_2$ gas into the depositing chamber. As gases introduced for allowing fluorine to be contained in the ZnO film layer, $F_2$, HF, $SiF_4$, $Si_2F_6$ and $CF_4$ are appropriate.

Substrate:

The substrate may comprise a single body of a conductive material or an insulating material, or a film layer formed on a support made of a conductive material or an insulating material.

As the conductive materials, for example, metals such as NiCr, stainless steel, Al, Cr, Mo, Au, Nb, Ta, V, Ti, Pt, Pb and Sn, or alloys of these metals may be included. In using these materials as a support, a shape of sheet or a shape of roll made by winding a belt-like sheet around a cylinder is desirable.

As the insulating materials, synthetic resins such as polyester, polyethylene, polycarbonate, cellulose acetate, polypropylene, polyvinyl chloride, polyvinylidene chloride, polystyrene and polyamide, or glass, ceramics or paper may be included. In using these materials as a support, a shape of sheet or a shape of roll made by winding a belt-like sheet around a cylinder is desirable.

In the photovoltaic element of the present invention, it is desirable to form a conductive thin film layer on one surface of a support and to form a ZnO film layer on the surface of the formed conductive film layer.

For example, a conductive film layer made of a material such as NiCr, Al, Ag, Cr, Mo, Ir, Nb, Ta, V, Ti, Pt, Pb, $In_2O_3$, $SnO_2$ and ITO ($In_2O_3$—$SnO_2$) or their alloys is formed on the surface for a glass support, a conductive film layer made of a material such as NiCr, Al, Ag, Pb, Zn, Ni, Au, Cr, Mo, Ir, Nb, Ta, V, Tl, and Pt or their alloys is formed on the surface of a synthetic resin sheet support such as polyester film, or a conductive film layer made of materials such as NiCr, Al, Ag, Cr, Mo, Ir, Nb, Ta, V, Ti, Pt, Pb, $In_2O_3$, $SnO_2$ and ITO ($In_2O_3$–$SnO_2$) or their alloys is formed for a stainless steel support.

Formation is carried out with the vacuum deposition process, the sputtering process, the screen printing process and the like. A desirable substrate surface form is a flat surface or an uneven surface with a protrusion height of 0.1–1.0 $\mu$m on average. The thickness of the substrate is appropriately determined in such a manner that a desired photovoltaic element can be formed, but when a flexibility is demanded for a photovoltaic element, can be made as thin as possible to such an extent as to allow the function of a support to be fully fulfilled. From the standpoints of fabrication, handling and mechanical strength of a support, however, the thickness is normally set in 10 $\mu$m or more.

As a preferred substrate form in the photovoltaic element of the present invention, a conductive film layer made of a metal with a high reflectance in the visual to near-infrared region such as Ag, Al, Cu and AlSi is formed on the above support. This layer functions as a light reflecting layer and an appropriate layer thickness of these metals as a reflecting layer is in the range of 10 nm to 5000 nm. To make the surface of a light reflecting layer uneven (texturization), the substrate temperature during the formation is preferably set at 200° C. or higher.

ZnO film layer:

The light transmittance of the fluorine-containing ZnO film layer formed with the above method is 85% or higher over the wavelength in the range of from 400 nm to 900 nm and the resistivity is $3 \times 10^{-4} \Omega \cdot cm$ or smaller. The fluorine content has a minimum ($C_{min}$) at the interface with the substrate and gradually increases toward the pin layer. Further, it has a maximum ($C_{max}$) at the crystal grain boundary. The order of 0.1% is appropriate for $C_{min}$ and the order of 10% is appropriate for $C_{max}$. Appropriate patterns of thickness-direction variation in fluorine content are a linearly increasing pattern from the substrate shown in FIG. 3A, an exponentially increasing pattern from the substrate shown in FIG. 3B and an abruptly increasing pattern near the interface with the pin layer shown in FIG. 3C.

p layer, n layer

These layers are important layers influential on the characteristic of a photovoltaic element and made of amorphous silicon type semiconductor material, microcrystalline silicon type semiconductor material or polycrystalline silicon type semiconductor material. As amorphous (abbreviated as "a-") silicon type semiconductor materials, a-Si, a-SiC, a-SiGe, a-SiGeC, a-SiO, a-SiN, a-SiON, a-SiCON and so on may be included. As microcrystalline (abbreviated to "$\mu$c-") silicon type semiconductor materials, $\mu$c-Si, $\mu$c-SiC, $\mu$c-SiGe, $\mu$c-SiO, $\mu$c-SiGeC, $\mu$c-SiN, $\mu$c-SiON, $\mu$c-SiOCN and so on may be included. As polycrystalline (abbreviated to "poly-") silicon type semiconductor materials, poly-Si, poly-SiC, poly-SiGe and so on may be included.

In the present invention, an n-type amorphous semiconductor is employed as a semiconductor layer being in contact with the ZnO film layer. Thus, the electric conjunction to a fluorine-doped ZnO layer having the same n-type conductivity becomes good and accordingly the carrier trapping at the interface decrease. Further, since fluorine is contained in both layers, the bonding becomes firmer, thereby preventing peeling off.

As a material of the layer on the incident light side, crystalline semiconductor with small photo-absorption or amorphous semiconductor with a wide band gap. Specifically, a-SiC, a-SiO, a-SiN, a-SiON, a-SiCON, $\mu$c-Si, $\mu$c-SiC, $\mu$c-SiO, $\mu$c-SiN, $\mu$c-SiON, $\mu$c-SiOCN, poly-Si and poly-SiC are appropriate.

The introduced quantity of a valence electron controlling agent for making the conductivity type p-type or n-type ranges preferably from 1000 ppm to 10%.

In addition, the hydrogen (H, D) and fluorine contained serve to compensate dangling bonds and improve the efficiency of doping. The most appropriate hydrogen and fluorine content is 0.1–30 atomic %. Especially for crystalline semiconductor layer, 0.01–10 atomic % is the most appropriate. Fluorine may be further contained in the i layer and the p layer.

The introduced quantity of oxygen and nitrogen atoms is 0.1 ppm–20% but preferably 0.1 ppm–1% when the content of traces is desired.

As electric characteristics, the activation energy is preferably 0.2 eV or smaller and most appropriately 0.1 eV or smaller. In addition, the resistivity is preferably 100 #$\Omega$cm or smaller and most appropriately 1 $\Omega$cm or smaller. Furthermore, the layer thickness is preferably 1–50 nm and most appropriately 3–30 nm.

Especially when the above crystalline semiconductor layer with small photoabsorption or amorphous semiconductor layer with a wide band gap is formed, it is preferable to dilute a raw gas 2- to 100-fold with a gas such as $H_2$, $D_2$ and He and to introduce a relatively high MW power or RF power.

In the photovoltaic element of the present invention, because fluorine is contained in the ZnO film layer and its content gradually increases toward the pin layer, damages to the ZnO film layer, i.e., the interface levels can be reduced even if a p layer or an n layer in contact with the ZnO film layer is formed using an especially high MW power.

i layer:

The i layer is the most important layer for producing and transporting photo-excited carriers in the photovoltaic element of the present invention. As the i layer, a slightly p type layer and a slightly n type layer can be employed and they are composed of a hydrogen-containing amorphous silicon type semiconductor material. For example, a-Si, a-SiC, a-SiGe, a-SiGeC, a-SiSn, a-SiSnC, a-SiSnGe, a-SiSnGeC and so on may be included.

The hydrogen (H, D) and fluorine contained in the i layer serve to compensate dangling bonds of the i layer and improve the product of the mobility and the lifetime of carriers in the i layer. In addition, they also serve to compensate the interface levels of the interface, and are effective in raising the photoelectromotive force, photocurrent and photoresponse of a photovoltaic element. The optimal hydrogen and fluorine content of the i layer is 1–30 atomic %.

The introduced quantity of oxygen and nitrogen atoms is preferably in the range of 0.1 ppm–1%.

The thickness of an i layer depends on the structure (e.g., pin, pinpin, nip) of a photovoltaic element and the band gap of the i layer and is optimally 0.05–1.0 $\mu$m.

The i layer of the present invention has a small tail state on the side of the valence electron band, the gradient of a tail state is 60 meV or smaller and the density of dangling bonds measured by the electron spin resonance (ESR) is $10^{17}/cm^3$ or less.

For formation of an i layer, the MWPCVD process is employed, and desirably RF power is simultaneously introduced in the MWPCVD as described above or RF power and DF power are simultaneously introduced in the MWPCVD as described above.

When forming a wide band gap a-SiC, it is preferable to dilute a raw gas 2- to 100-fold with a gas such as $H_2$, $D_2$ or He and to introduce a relatively high MW power.

Transparent electrode:

Materials fit for a transparent electrode are indium oxide ($In_2O_3$), tin oxide ($SnO_2$) and ITO ($In_2O_3$–$SnO_2$), and these materials may contain fluorine.

For formation of a transparent electrode, the sputtering process and the vacuum deposition process are optimal. In formation with the sputtering process, an appropriate combination of targets such as a metal target or an oxide target is employed.

In formation with the sputtering process, the substrate temperature is an important factor and ranges preferably from 20° C. to 600° C. As a gas for sputtering in formation of a transparent electrode with sputtering process, an inert gas such as Ar gas may be included. In addition, it is preferable to add oxygen gas ($O_2$) to the above inert gas if necessary. Especially when a metal is employed as a target, oxygen gas ($O_2$) is indispensable. Furthermore, when a target is sputtered using the above inert gas or the like, a preferred pressure is in the range of 0.1–50 mTorr for an effective sputtering. The deposition rate of a transparent electrode depends on pressure and introduced electric power, and an optimal deposition rate is in the range of 0.01–10 nm/sec.

As evaporation sources appropriate for formation of a transparent electrode in the vacuum deposition, metal tin, metal indium and indium-tin alloy are referred to. And an appropriate substrate temperature in forming a transparent electrode is in the range of 25° C.–600° C. Furthermore, it is necessary to introduce oxygen gas ($O_2$) and to form a transparent electrode in a pressure range of $5 \times 10^{-5}$ Torr–$9 \times 10^{-4}$ Torr. By introducing oxygen in this range, the above metal evaporated from a vapor deposition source reacts with oxygen in the gas phase to form a good transparent electrode. A preferred deposition rate of a transparent electrode under the above conditions is in the range of 0.01–10 nm/sec. For a deposition rate of less than 0.01 nm/sec, the productivity lowers, whereas a coarse film is formed and the transmittance, the conductivity and the close adhesion decrease for a deposition rate of more than 10 nm/sec.

The layer thickness of a transparent electrode is determined preferably so as to meet the conditions for a reflectance preventing film. Specifically, a preferred thickness is in the range of 50–500 nm.

Collector electrode:

For allowing a larger quantity of light to be incident on the i layer of a photovoltaic layer and collecting generated carriers to a collector electrode with good efficiency, the shape (shape viewed from the incident direction of light) and the material of the collector electrode are important. Normally, a comb-shaped collector electrode is employed and its line width and number of lines are determined by the shape of a photovoltaic element viewed from the incident direction of light, the size and the material of a collector electrode. The line width is normally on the order of 0.1 mm–5 mm. As a material of a collector electrode, Fe, Cr, Ni, Au, Ti, Pd, Ag, Al, Cu, AlSi and C (graphite) are employed. Normally, small resistivity metals such as Ag, Cu, Al and Cr or their alloys are appropriate. The layer structure of a collector electrodes may be a single-layer structure or a multilayer structure. These metals are formed desirably with the vacuum deposition process, the sputtering process, the plating process, the printing process or the like.

In formation with the vacuum deposition, a desired metal vacuum deposition source is evaporated under vacuum with electron beam or resistor heating with a mask of the collector electrode shape set in close contact on the transparent electrode to form a collector electrode of a desired shape on the transparent electrode.

In formation with the sputtering, by introducing Ar gas into vacuum with a mask of the collector electrode shape set in close contact onto the transparent electrode, applying a DC power to a desired metal sputter target and generating a glow discharge, the metal is sputtered to form a collector electrode of a desired shape on the transparent electrode.

In formation with the printing, Ag paste, Al paste or carbon paste is printed by using a screen printer.

An appropriate thickness of these metals is in the range of 10 nm–0.5 mm.

EXAMPLES

Hereinafter, the photovoltaic element of the present invention will be described in detail by referring to the fabrication of a solar cell and a photodiode comprising non-single-crystal silicon type semiconductor material, but the present invention is not limited to this.

(Example 1)

Using the depositing apparatus shown in FIG. 2, a solar cell having a structure shown in FIG. 1 was fabricated.

To the depositing apparatus of FIG. 2, a raw gas supply device (not shown) is connected through gas introducing pipes. Each of cylinders stores a raw gas which is refined to ultrahigh purity. A $SiH_4$ gas cylinder, a $SiF_4$ gas cylinder, a $CH_4$ gas cylinder, a $GeH_4$ gas cylinder, a $SnH_4$ gas cylinder, a $PH_3/H_2$ (dilution: 100 ppm) gas cylinder, a $B_2H_6/H_2$ (dilution: 100 ppm) gas cylinder, a $H_2$ gas cylinder and an Ar gas cylinder are connected. There are a target of Ag and a target of ZnO:F (1%), both of which can be switched over in vacuum to accomplish a sputtering. A RF power source was used for a bias power source.

First, fabrication of a substrate was made. A stainless steel plate, 0.5 mm in thickness and 50×50 $mm^2$ in area, was subjected to a ultrasonic cleaning with acetone and isopropanol and dried under warm air. A DC power source was connected as the sputter power source and an Ag light reflecting layer is formed using the DC magnetron sputtering process. With this stainless steel plate set in close contact with the heater 205 of FIG. 2, the depositing chamber 201 was evacuated from the exhaust port 220 connected to an oil diffusion pump. When the pressure became $1 \times 10^{-6}$ Torr, 50 sccm of Ar gas was introduced and the pressure was adjusted with the conductance valve 207 in such a manner to reach 7 mTorr. When the substrate temperature became 150° C., current is made to flow through a toroidal coil 221 and a DC power of 400 V is applied from the sputter power source 214 to produce Ar plasma. When a target shutter 217 and a substrate shutter 215 were opened and a 0.3 μm thick Ag light reflecting layer was formed on the stainless steel plate surface, both shutters were closed, plasma was made to vanish and the fabrication of a substrate was finished.

Next, a ZnO film layer with the fluorine content varied in the layer thickness direction was formed using the forming method (1). By switching the target electrode over to a RF power source, introducing 50 sccm of Ar gas into the depositing chamber, setting the substrate temperature and pressure to 350° C. and 5 mTorr, respectively, and applying a RF power of 300 W from a sputter power source to the target electrode, Ar plasma was produced. When, by opening the target shutter and the substrate shutter, monotonously increasing the RF power with the lapse of time, a 2.0 $\mu$m thick fluorine-containing ZnO film layer was formed on the Ag light reflecting layer surface, both shutters were closed and plasma was made to vanish.

Next, on the ZnO film layer, an n layer, an i layer and a p layer are formed in sequence. The n layer made of a-Si and the i layer made of a-Si were formed with the RFPCVD process, and the p layer made of a-SiC was formed with the MWPCVD process.

To form an n layer made of a-Si, after 300 sccm of $H_2$ gas were introduced, and the pressure inside the depositing chamber and the substrate temperature were stabilized respectively at 1.0 Torr and 250° C., 2 sccm of $SiH_4$ gas, 200 sccm of $PH_3/H_2$ gas and 100 sccm of $H_2$ gas were introduced and the pressure of the depositing chamber was adjusted in such a manner as to be kept at 1.0 Torr. With the power of the RF power source set to 5 W and a RF power applied to the bias electrode, plasma was produced. When, by opening the substrate shutter, formation of an n layer on the ZnO film layer was initiated and the 20 nm thick n layer was formed, the substrate shutter was closed, the RF power was shut off, plasma was made to vanish and the formation of an n layer ended. The inflow of $SiH_4$ gas and $PH_3/H_2$ gas into the depositing chamber was stopped. After 5 minutes continued flow of $H_2$ into the depositing chamber, the inflow of $H_2$ was also stopped, and the interior of the depositing chamber and that of the gas piping were evacuated to $1\times10^{-5}$ Torr.

To form an i layer made of a-Si, 500 sccm of $H_2$ gas was introduced in such a manner that the pressure and the substrate temperature became respectively 1.5 Torr and 250° C. When the substrate temperature was stabilized, $SiH_4$ gas was flowed in. Such adjustment was accomplished that the flow rate of $SiH_4$ gas, that of $H_2$ gas and the inner pressure of the depositing chamber became 50 sccm, 500 sccm and 1.5 Torr, respectively. Next, with the power of a RF power source set to 50 W and applied to the bias electrode, plasma was produced, the substrate shutter was opened and formation of an i layer was initiated on the n layer. When the 250 nm thick i layer was formed, the substrate shutter was closed, the RF power was shut off, plasma was made to vanish and the formation of an i layer ended. The inflow of $SiH_4$ gas into the depositing chamber was stopped. After 5 minutes continued flow of $H_2$ into the depositing chamber, the inflow of $H_2$ was also stopped, and the interior of the depositing chamber and that of the gas piping were evacuated to $1\times10^{-5}$ Torr.

To form a p layer made of a-SiC, 500 sccm of $H_2$ gas was introduced in such a manner that the pressure of the depositing chamber and the substrate temperature became respectively 0.02 Torr and 200° C. When the substrate temperature was stabilized, $SiH_4$ gas, $CH_4$ gas and $B_2H_6/H_2$ gas were flowed in. At that time, such adjustment was accomplished that the flow rate of $SiH_4$ gas, that of $CH_4$ gas, that of $H_2$ gas, that of $B_2H_6/H_2$ gas and the pressure became 10 sccm, 2 sccm, 100 sccm, 500 sccm and 0.02 Torr, respectively. Thereafter, with the power of the MW power source set to 500 W, MW power was introduced through the dielectrics window, plasma was produced, the substrate shutter was opened and formation of a p layer on the i layer was started. When a 10 nm thick p layer was formed, the substrate shutter was closed, the MW power was shut off, plasma was made to vanish and the formation of a p layer was completed. The inflow of $SiH_4$ gas, $CH_4$ gas and $B_2H_6/H_2$ gas was stopped. After 5 minutes continued flow of $H_2$, the inflow of $H_2$ was also stopped, the interior of the depositing chamber and that of the gas piping were evacuated to $1\times10^{-5}$ Torr and the depositing chamber was leaked.

Next, on the p layer, a 70 nm thick ITO was vacuum deposited as a transparent electrode with the resistor heating vacuum deposition process. Next, with a comb-shaped hole opened mask put on the transparent electrode, a comb-shaped collector electrode comprising Cr (40 nm)/Ag (1000 nm)/Cr (40 nm) was deposited with the electron beam vacuum deposition process.

In these, the fabrication of a solar cell was completed.

This solar cell will be referred to as "SC Ex. 1".

<Comparative Example 1-1>

By following the procedure of Example 1 except that the RF power was kept constant with respect to time in forming a ZnO film layer, a solar cell (SC Comp. 1-1) was fabricated.

<Comparative Example 1-2>

By following the procedure of Example 1 except that ZnO not containing fluorine was employed for the target in forming a ZnO film layer, a solar cell (SC Comp. 1-2) was fabricated.

<Comparative Example 1-3>

By following the procedure of Example 1 except that the substrate temperature was set to 80° C. in forming a ZnO film layer, a solar cell (SC Comp. 1-3) was fabricated.

Solar cells (SC Ex. 1), (SC Comp. 1-1), (SC Comp. 1-2) and (SC Comp. 1-3) were fabricated six for each, and the initial photoelectric conversion efficiency (photoelectromotive force/incident light electric power), deterioration by vibration and deterioration by light were measured.

Measurement of the initial photoelectric conversion efficiency is carried out by placing a fabricated solar cell under light irradiation of AM-1.5 (100 mW/cm$^2$) and measuring the V-I characteristic.

Measurement of the deterioration by vibration is carried out as follows. After placing a solar cell of which initial photoelectric conversion efficiency has been previously measured in the above manner in a dark place at a humidity of 50% and a temperature of 25° C. and applying to the solar cell a vibration of vibrational amplitude 0.1 mm at a vibrational frequency of 60 Hz for 500 hours, the photoelectric conversion efficiency under light irradiation of AM-1.5 is measured. The deterioration by vibration is determined on the basis of the reduction ratio in photoelectric conversion efficiency (i.e., photoelectric conversion efficiency after deterioration by vibration test/initial photoelectric conversion efficiency).

Measurement of the deterioration by light is carried out as follows. After placing a solar cell of which initial photoelectric conversion efficiency has been previously measured in the above manner in an environment with a humidity of 50% and a temperature of 25° C. and irradiating the solar cell with an AM-1.5 light for 500 hours, the photoelectric conversion efficiency under light irradiation of AM-1.5 is measured. The deterioration by light is determined on the basis of a reduction ratio in photoelectric conversion efficiency (i.e., photoelectric conversion efficiency after deterioration by light test/initial photoelectric conversion efficiency).

As a result of the measurement, the initial photoelectric conversion efficiency, the reduction ratio in photoelectric conversion efficiency after deterioration by light and the reduction ratio in photoelectric conversion efficiency after deterioration by vibration for (SC Comp. 1-1), (SC Comp. 1-2) and (SC Comp. 1-3) relative to (SC Ex. 1) were obtained as follows. These differences originated chiefly from the difference in open-circuit voltage and the difference in short-circuit photocurrent.

|  | Initial photoelectric conversion efficiency | Deterioration by vibration | Deterioration by light |
|---|---|---|---|
| (SC Ex. 1) | 1.00 | 1.00 | 1.00 |
| (SC Comp. 1-1) | 0.91 | 0.90 | 0.91 |
| (SC Comp. 1-2) | 0.92 | 0.90 | 0.89 |
| (SC Comp. 1-3) | 0.90 | 0.91 | 0.91 |

First, on electron microscopic observation of the surface of solar cells, the surface was uneven (texturized) as shown in FIG. 1 for (SC Ex. 1), (SC Comp. 1-1) and (SC Comp. 1-2). Study of the surface unevenness using a surface roughness tester revealed that the averaged protrusion height was about 0.12 $\mu$m. The surface unevenness of (SC Comp. 1-3) was 0.05 $\mu$m or less.

Next, samples of ZnO film layers employed in the four kinds of solar cells were prepared and the crystallinity was evaluated using an X-ray diffractometer, which revealed that there was a c-axis orientation for (SC Ex. 1), (SC Comp. 1-1) and (SC Comp. 1-2) but there was no crystallinity for (SC Comp. 1-3).

Figure 3A:
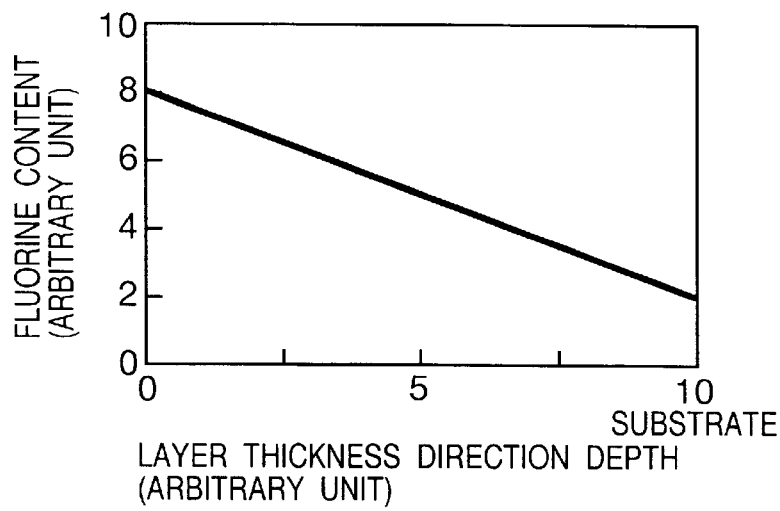
FIGS. 3A to 3C are graphs showing a thickness-directional variation of the fluorine content in the ZnO thin film layer.

Next, on determining a change in fluorine content in the layer thickness direction by using SIMS for the prepared (SC Ex. 1), the dependence in the ZnO film layer was obtained as shown in FIG. 3A and the fluorine content was found to vary depending on the RF power of the sputter power source. There was no change in the layer thickness direction for (SC Comp. 1-1), no content of fluorine was detected for (SC Comp. 1-2) and a change similar to that of (SC Ex. 1) was obtained for (SC Comp. 1-3).

As described above, the solar cell (SC Ex. 1) of the present invention was found to have a further better characteristic than the conventional solar cells (SC Comp. 1-1), (SC Comp. 1-2) and (SC Comp. 1-3).

(Example 2)

A solar cell having a structure shown in FIG. 1, with the c-axis nearly perpendicular to the substrate and a large fluorine content at the crystal grain boundaries, was prepared. By following the procedure of Example 1 except that the substrate temperature was set to 350° C. in forming an Ag light reflecting layer and the RF power of the sputter power source was abruptly increased just before the respective crystal grains came into contact with one another, a solar cell (SC Ex. 2) was fabricated. Then, on measurements similar to those of Example 1, the deterioration by vibration and the deterioration by light were substantially the same degree, but the solar cell (SC EX. 2) was found to have a further better initial photoelectric conversion efficiency than that of the solar cell (SC Ex. 1). This is because the surface unevenness was made more appropriate and the shortcircuit current was raised.

<Comparative Example 2-1>

By following the procedure of Example 2 except that a target not containing fluorine was employed in forming a ZnO film layer, a solar cell (SC Comp. 2-1) was fabricated.

<Comparative Example 2-2>

By following the procedure of Example 2 except that the RF power of a sputter power source was kept constant in forming a ZnO film layer, a solar cell (SC Comp. 2-2) was fabricated.

<Comparative Example 2-3>

By following the procedure of Example 2 except that the substrate temperature was set to 80° C. in forming a ZnO film layer, a solar cell (SC Comp. 2-3) was fabricated.

First, on electron microscopic observation of the surface of solar cells, the surface was uneven (texturized) as shown in FIG. 1 for (SC Ex. 2), (SC Comp. 2-1) and (SC Comp. 2-2). Study of the surface unevenness using a surface roughness tester revealed that the averaged protrusion height was about 0.21 $\mu$m.

The surface unevenness of (SC Comp. 2-3) was 0.05 $\mu$m or less in protrusion height. In addition, evaluation of the crystallinity by using an X-ray diffractometer revealed that there was a c-axis orientation for (SC Ex. 2), (SC Comp. 2-1) and (SC Comp. 2-2) and the c-axis was perpendicular to the substrate. (SC Comp. 2-3) was revealed to have no orientation and no crystallinity.

In addition, with a forward bias applied, deterioration by vibration and deterioration by light were measured. 0.8 V was applied as a forward bias at a humidity of 50% and a temperature of 25° C. for the solar cells (SC Ex. 2), (SC Comp. 2-1), (SC Comp. 2-2) and (SC Comp. 2-3) of which initial photoelectric conversion efficiency has been previously measured, deterioration by vibration and deterioration by light were measured. As a result of measurements, (SC Ex. 2) was found to have further better characteristic than those of (SC Comp. 2-1), (SC Comp. 2-2) and (SC Comp. 2-3).

(Example 3)

A photodiode (PD EX. 3) having the layer structure shown in FIG. 1 was prepared. First, preparation of a substrate was performed. A glass plate, 0.5 mm in thickness and 20×20 mm$^2$ in surface area, was subjected to a ultrasonic cleaning with acetone and isopropanol and dried under hot air. Using the vacuum deposition process, a 0.1 $\mu$m thick Al light reflecting layer was formed at room temperature on the surface of the glass substrate and the preparation of the substrate was completed.

Figure 3B:
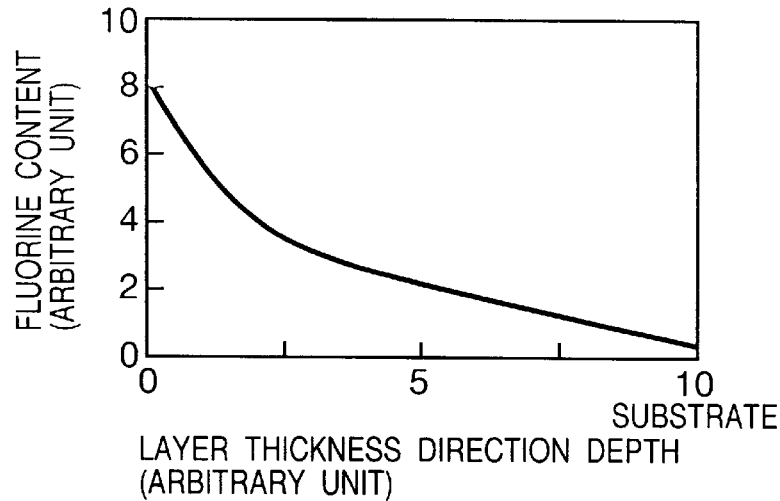

Using the procedure of Example 1, a ZnO film layer, an n layer (a-Si, RFPCVD process), an i layer (a-Si, RFPCVD process) and a p layer (a-SiC, MWPCVD process) were formed in this order on the substrate. In forming a ZnO film layer, a target not containing fluorine was employed with the method (2), $F_2$ was introduced as a gas containing fluorine, and the fluorine content was made to vary as shown in FIG. 3B by changing the flow rate with the lapse of time. Next, a transparent electrode and a collector electrode similar to those of Example 1 were formed on the p layer.

<Comparative Example 3-1>

By following the procedure of Example 3 except that the flow rate of $F_2$ gas was not changed with the lapse of time in forming a ZnO film layer, a photodiode (PD Comp. 3-1) was fabricated.

<Comparative Example 3-2>

By following the procedure of Example 3 except that $F_2$ gas was not introduced in forming a ZnO film layer, a photodiode (PD Comp. 3-2) was fabricated.

<Comparative Example 3-3>

By following the procedure of Example 3 except that the substrate temperature was set to 80° C. in forming a ZnO film layer, a photodiode (PD Comp. 3-3) was fabricated.

The ON-OFF ratio of the fabricated photodiodes (photocurrent/dark current at irradiation of AM-1.5 light; measured frequency: 10 kHz) was measured. This will be referred to as initial ON-OFF ratio. Next, deterioration by light and deterioration by vibration were measured with regard to ON-OFF ratio in the same manner as for Example 1. As a result of measurements, the photodiode of the present invention (PD Ex. 3) was found to have further better characteristics than those of conventional photodiodes (PD Comp. 3-1), (PD Comp. 3-2) and (PD Comp. 3-3).

(Example 4)

Figure 3C:
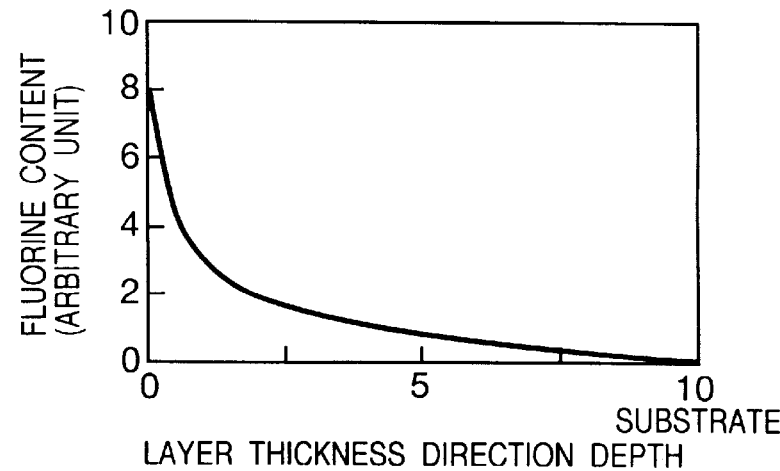

A solar cell (SC EX. 4) of FIG. 1 having a nip structure with a microcrystalline-silicon-containing p layer formed on the ZnO film layer was fabricated. A ZnO film layer was formed by following the procedure of Example 1, on which a p layer ($\mu$c-Si, RFPCVD process), an i layer (a-Si, RFPCVD process) and an n layer (a-SiC, MWPCVD process) were formed. In forming the ZnO film layer, the forming method (3) was employed, and the fluorine content was made to vary as shown in FIG. 3C by changing the RF power with the lapse of time. A transparent electrode and a collector electrode were formed by following the procedure of Example 1.

On measurements similar to those of Example 1, the solar cell of the present invention (SC Ex. 4) was found to have further excellent characteristics than those of conventional solar cells (SC Comp. 1-1), (SC Comp. 1-2) and (SC Comp. 1-3), like (SC Ex. 2).

(Example 5)

A solar cell (SC Ex. 5) with fluorine contained in an n layer was fabricated. By following the procedure of Example 2 except that 1 sccm of $SiF_4$ was introduced anew in forming the n layer, a fabrication was made.

<Comparative Example 5>

By following the procedure of Example 5 except that a ZnO target not containing fluorine was employed in forming a ZnO film layer, a solar cell (SC Comp. 5) was fabricated.

On measurements similar to those of Example 1, the solar cell of the present invention (SC Ex. 5) was found to have equivalent characteristics to that of (SC Comp. 5). However, no separation of layers was observed in (SC Ex. 5) but a separation of layers was slightly observed in (SC Comp. 5)

(Example 6)

A ZnO film layer similar to that of Example 2 was formed on a glass substrate, a p layer and an n layer similar to those of Example 1 except that 10 sccm of $SnH_4$ gas was flowed in forming an i layer, were formed, and a solar cell (SC Ex. 6) with a 0.5 $\mu$m thick light reflecting layer made of Al formed on the pin layer was fabricated. The light reflecting layer was formed with the electron beam vacuum deposition process.

<Comparative Example 6>

By following the procedure of Example 6 except that a target not containing fluorine was employed in forming a ZnO film layer, a solar cell (SC Comp. 6) was fabricated.

On measurement similar to that of Example 1 under irradiation of light from the rear side of the glass substrate, (SC Ex. 6) was found to have excellent characteristics than those of (SC Comp. 6).

(Example 7)

Using a depositing apparatus of FIG. 5 to which the Roll-to-Roll method was applied, a solar cell of pinpin type was fabricated. As the substrate (support), a belt-like stainless steel plate, 300 m in length, 30 cm in width and 0.1 mm in thickness was employed.

Figure 4:
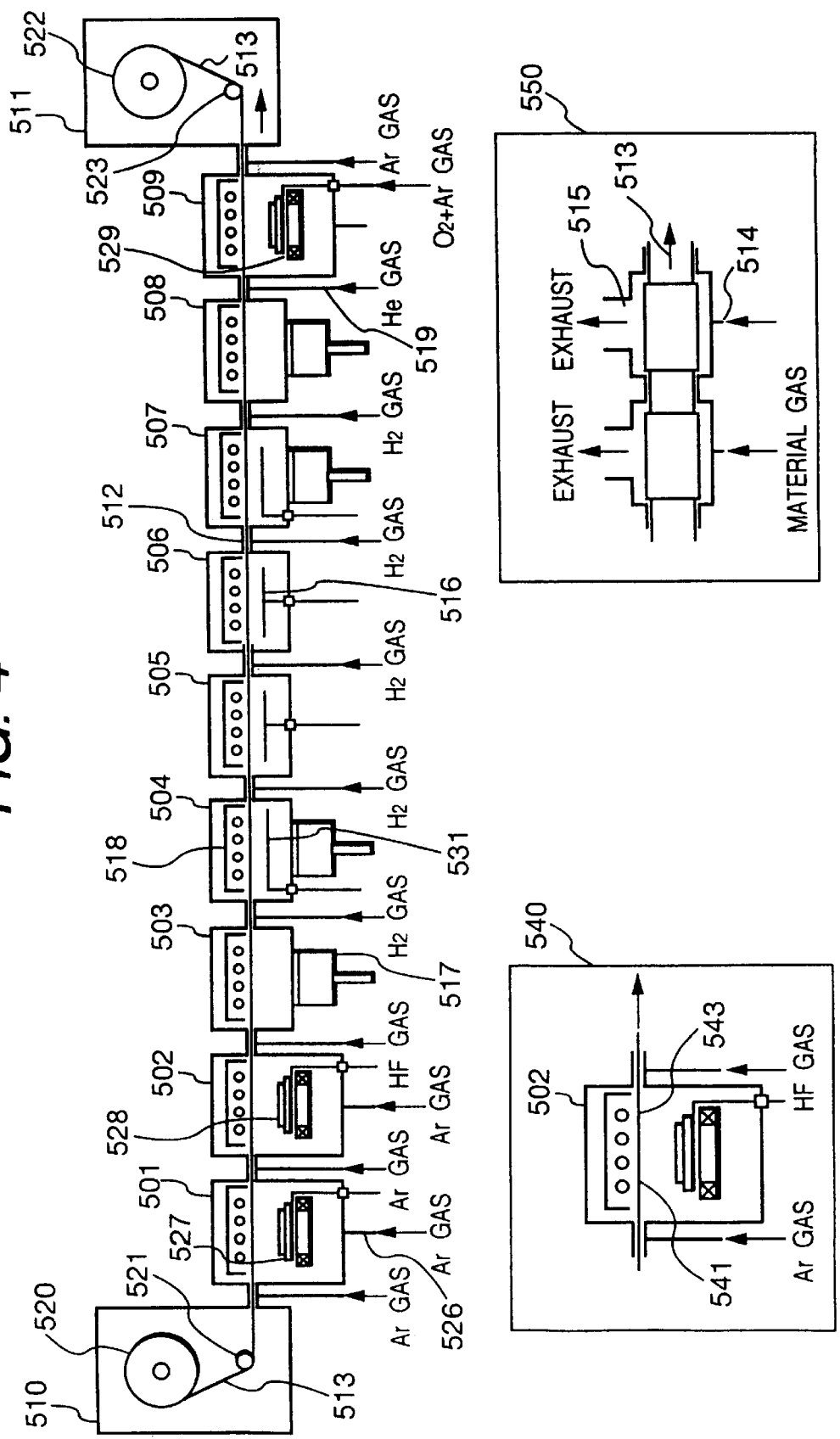
FIG. 4 is a conceptual drawing of a deposition apparatus of the Roll-to-Roll method.

FIG. 4 is a schema of a continuous forming apparatus of photovoltaic elements by utilizing the Roll-to-Roll method. This apparatus comprises a substrate delivery chamber 510, a plurality of depositing chambers 501–509 and a substrate winding chamber 511 disposed in sequence, between which a separating passage 512 is connected. Each depositing chamber is provided with an exhaust port and its interior can be evacuated to vacuum. A belt-like substrate 513 passes through these depositing chambers and the separating passage, is wound from the substrate delivery chamber into the substrate winding chamber. At the same time, it is arranged that, from the gas inlet of each depositing chamber and the separating passage, gas is introduced, gas is exhausted from individual exhaust port and individual layers can be formed.

A light reflecting layer made of AlSi (9:1), a fluorine-contained ZnO film layer, a pinpin layer and a transparent electrode made of ITO are formed in the depositing chamber 501, the depositing chamber 502, the depositing chambers 503–508 and the depositing 509, respectively. Inside each depositing chamber, a halogen lamp heater 518 for heating the substrate from the rear side is installed and the substrate is heated to a predetermined temperatures in the respective depositing chambers.

In the depositing chamber 501, the DC magnetron sputtering process is performed, Ar gas is introduced from the gas inlet 526 and AlSi (9:1) is employed as the target. In the depositing chamber 502, the RF magnetron sputtering process is performed, Ar gas is introduced and fluorine-not-contained ZnO is employed as the target. In the depositing chamber 509, the RF magnetron sputtering process is performed, $O_2$ gas and Ar gas are introduced and ITO ($In_2O_3$—$SnO_2$ (5 wt %)) is employed as the target.

Block 550 is a top view of the depositing chambers 503–508, each depositing chamber has a raw gas inlet 514 and an exhaust port 515 and is equipped with a RF electrode 516 or a micro wave applicator 517, and a raw gas supply device (not shown) is connected to the raw gas inlet 514. To the exhaust port of each depositing chamber, a vacuum exhaust pump (not shown), such as oil diffusion pump and mechanical booster pump, is connected and the separating passage 512 connected to a depositing chamber has a inlet 519 for allowing a scavenge gas to flow in, through which a scavenge gas as shown in FIG. 4 is introduced.

An ordinary MWPCVD, a bias-applied MWPCVD and an ordinary RFPCVD can be executed in the depositing chambers 503 and 508, in the depositing chambers 504 and 507, and in the depositing chambers 505 and 506, respectively. In the depositing chambers for an i layer, depositing chambers 504 and 507, a bias electrode 531 is placed, to which a RF power source (not shown) is connected as the power source.

Block 540 is a side view of the depositing chamber 502, and to allow the fluorine content to gradually vary in the layer thickness direction, HF gas was employed for a scavenge gas to be introduced in the separating passage between the depositing chamber 502 and the depositing chamber 503. In this arrangement, a part of HF gas flows into the depositing chamber 502 and such a change in fluorine content is obtained that a large quantity of fluorine is contained near the interface with the pin layer (around the position 543) and the content gradually decreases toward the interface 541 with the Ag light reflecting layer (toward the position 541).

In the substrate delivery chamber 510, in order to give a moderate degree of tension to the delivery roll 520 and the substrate and to always keep the substrate horizontal a guide roller 521 for always keeping the substrate in the horizontal direction is provided, while a winding roll 522 and a guide roller 523 are provided in the substrate winding chamber 511.

First, after the stainless steel sheet is wound around the delivery roll (average radius of curvature: 30 cm), set in the substrate delivery chamber and allowed to pass through individual depositing chambers, the top end of the substrate is wound onto the substrate winding roll. The whole apparatus is evacuated using a vacuum exhaust pump, then the lamp heater of each depositing chamber is lighted and set in such a manner that the substrate temperature in each depositing chamber becomes a predetermined temperature. When the pressure of the whole apparatus becomes below 1 mTorr, a scavenge gas is allowed to flow in from the scavenge gas inlet 519 as shown in FIG. 4, and the substrate is wound with the winding roll while being moved along the arrow direction. Into the respective depositing chambers, the respective raw materials are allowed to flow. At that time, to prevent the raw gas allowed to flow into each depositing chamber from diffusing into other depositing chambers, the flow rate of gas allowed to flow in the respective separating passages or the pressure of each depositing chamber is adjusted. Next, by introducing a RF power or MW power, plasma is produced to form the respective layers.

In the depositing chamber 501, an AlSi light reflecting layer (substrate temperature: 350° C.; layer thickness: 300 nm) was formed on the substrate, a ZnO film layer (substrate temperature: 350° C.; layer thickness: 600 nm) was formed in the depositing chamber 502, an n1 layer (a-Si; layer thickness: 20 nm) is formed in the depositing chamber 503, then an i1 layer (a-SiGe; layer thickness: 180 nm) in the depositing chamber 504, a p1 layer ($\mu$c-Si; layer thickness: 10 nm) in the depositing chamber 505, an n2 layer ($\mu$c-Si; layer thickness: 20 nm) in the depositing chamber 506, an i2 layer (a-Si; layer thickness: 250 nm) in the depositing chamber 507, a p2 layer ($\mu$c-SiC; layer thickness: 10 nm) in the depositing chamber 508 and a transparent electrode (ITO; layer thickness: 75 nm) in the depositing chamber 509 were formed in sequence.

When the winding of substrate ended, MW power source, RF power source and sputter power source were all shut off, plasma was made to vanish and the inflow of raw gas and scavenge gas was stopped. The whole apparatus was leaked and the wound roll was taken out.

Next, a carbon paste, 5 $\mu$m in layer thickness and 0.5 mm in line width, was printed with the screen printing, on which a silver paste, 10 $\mu$m in layer thickness and 0.5 mm in line width, was printed, a collector electrode was formed and a roll-like solar cell was cut in the size of 250 mm×100 mm.

Thus, fabrication of a pinpin type solar cell (SC Ex. 7) using the Roll-to-Roll method was completed.

<Comparative Example 7>

By following the procedure of Example 7 except that the scavenge gas to be flowed in the separating passage between the depositing chambers 502 and 503 is replaced with Ar gas so as not to incorporate fluorine into the ZnO film layer, a solar cell (SC Comp. 7) was fabricated.

On measurements similar to those of Examples 1 and 2, the solar cell (SC Ex. 7) of the present invention was revealed to have further excellent characteristics than those of the conventional solar cell (SC Comp. 7). In addition, on evaluating the crystallinity by using a X-ray diffractometer similarly as in Example 1, both (SC Ex. 7) and (SC Comp. 7) were revealed to have a c-axis orientation. In addition, SIMS revealed that the fluorine content in the ZnO film varied as shown in FIG. 3B for (SC Ex. 7). For (SC Comp. 7), fluorine was not contained. After solar cells wound in a roll shape were preserved for 3 months in the dark, no separation of layers was observed for (SC Ex. 7) but a slight separation of layers was observed for (SC Comp. 7).

What is claimed is:

1. A photovoltaic element comprising:
   (a) a substrate with a conductive surface;
   (b) a zinc oxide layer containing fluorine; and
   (c) a non-single-crystal semiconductor layer stacked in this sequence,
   wherein the fluorine content in said zinc layer (i) varies in the layer thickness direction, (ii) has a minimum at the interface with said substrate and (iii) increases toward said non-single-crystal semiconductor layer.

2. A photovoltaic element as set forth in claim 1, wherein the fluorine content in said zinc oxide ranges from 0.1 to 10 atomic %.

3. A photovoltaic element as set forth in claim 1, wherein said substrate is elastic and is belt shaped.

4. A photovoltaic element as set forth in claim 1, wherein said substrate comprises a conductive material.

5. A photovoltaic element as set forth in claim 1, wherein said substrate is a resin film on which a metal layer is deposited.

6. A photovoltaic element as set forth in claim 5, wherein said metal layer comprises at least one of gold, silver, copper or aluminum.

7. A photovoltaic element as set forth in claim 1, wherein said zinc oxide layer is a c-axis oriented crystalline layer and has a surface unevenness of 0.1–1.0 $\mu$m.

8. A photovoltaic element as set forth in claim 7, wherein said c-axis is perpendicular to the substrate surface.

9. A photovoltaic element as set forth in claim 1, wherein said non-single-crystal semiconductor layer contains microcrystalline silicon.

10. A photovoltaic element as set forth in claim 1, wherein said non-single-crystal semiconductor layer contains fluorine.

11. A photovoltaic element comprising:
    (a) a substrate with a conductive surface; and
    (b) an n-type amorphous semiconductor layer stacked on a fluorine-containing zinc oxide layers;
    wherein the fluorine content in said zinc oxide layer (i) varies in the layer thickness direction, (ii) has a minimum at the interface with said substrate and (iii) increases toward said n-type amorphous semiconductor layer.

12. A photovoltaic element as set forth in claim 11, wherein the fluorine content in said zinc oxide layer ranges from 0.1 to 10 atomic %.

13. A photovoltaic element as set forth in claim 11, wherein said zinc oxide layer is a c-axis oriented crystalline layer and has a surface unevenness of 0.1–1.0 $\mu$m.

14. A photovoltaic element as set forth in claim 11, wherein said c-axis is perpendicular to the substrate surface.

15. A photovoltaic element as set forth in claim 11, wherein said zinc oxide layer comprises a plurality of crystal grains, said crystal grains interfacing at crystal grain boundaries and wherein the content of fluorine is greater at each said crystal grain boundary than at the inside of the crystal grains.

16. A photovoltaic element as set forth in claim 11, wherein said n-type amorphous semiconductor layer contains fluorine.

* * * * *

UNITED STATES PATENT AND TRADEMARK OFFICE
CERTIFICATE OF CORRECTION

PATENT NO. : 5,849,108

DATED : December 15, 1998

INVENTOR(S) : TOSHIMITSU KARIYA ET AL.

It is certified that error appears in the above-identified patent and that said Letters Patent is hereby corrected as shown below:

COLUMN 1

Line 49, "CAP" should read --GAP--.

COLUMN 2

Line 31, "are" should read --is--.

COLUMN 3

Line 44, "an" should read --a--.
   Line 52, "increase" should read --increases--.

COLUMN 4

Line 30, "non-singlecrystal" should read
     --non-single-crystal--.

COLUMN 5

Line 18, "is" (first occurrence) should read --are--.

UNITED STATES PATENT AND TRADEMARK OFFICE
CERTIFICATE OF CORRECTION

PATENT NO. : 5,849,108

DATED : December 15, 1998

INVENTOR(S) : TOSHIMITSU KARIYA ET AL.

It is certified that error appears in the above-identified patent and that said Letters Patent is hereby corrected as shown below:

COLUMN 6

Line 16, "is" should read --are--.

COLUMN 8

Line 22, "Preferable ranges" should read
     --A preferable range--.

COLUMN 11

Line 11, "$In_2O_3$," should read --$In_2O_3$,--.
   Line 51, "p layer, n layer" should read
     --P-layer; N-layer--.

COLUMN 12

Line 4, "decrease." should read --decreases.--.

Line 9, "gap." should read --gap is employed.--.

UNITED STATES PATENT AND TRADEMARK OFFICE
CERTIFICATE OF CORRECTION

PATENT NO.  : 5,849,108

DATED       : December 15, 1998

INVENTOR(S) : TOSHIMITSU KARIYA ET AL.

It is certified that error appears in the above-identified patent and that said Letters Patent is hereby corrected as shown below:

COLUMN 14

Line 53, "a" should read --an--.

COLUMN 17

Line 66, "shortcircuit" should read
     --short-circuit--.

COLUMN 20

Line 29, "temperatures" should read --temperature--.
   Line 48, "has a" should read --has an--.

COLUMN 21

Line 67, "a" should read --an--.

UNITED STATES PATENT AND TRADEMARK OFFICE
CERTIFICATE OF CORRECTION

PATENT NO. : 5,849,108

DATED : December 15, 1998

INVENTOR(S) : TOSHIMITSU KARIYA ET AL.

It is certified that error appears in the above-identified patent and that said Letters Patent is hereby corrected as shown below:

COLUMN 22

Line 43, "layers;" should read --layer;--.

Signed and Sealed this

Fourteenth Day of December, 1999

Attest:

Q. TODD DICKINSON

*Attesting Officer*    *Acting Commissioner of Patents and Trademarks*